(12) United States Patent
Han et al.

(10) Patent No.: US 11,764,140 B2
(45) Date of Patent: Sep. 19, 2023

(54) SEMICONDUCTOR DEVICE

(71) Applicant: SAMSUNG ELECTRONICS CO., LTD., Suwon-si (KR)

(72) Inventors: Sang-Uk Han, Asan-si (KR); Duck Gyu Kim, Suwon-si (KR); Min Ki Kim, Suwon-si (KR); Jae-Min Jung, Seoul (KR); Jeong-Kyu Ha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 225 days.

(21) Appl. No.: 17/391,164

(22) Filed: Aug. 2, 2021

(65) Prior Publication Data

US 2022/0165652 A1 May 26, 2022

(30) Foreign Application Priority Data

Nov. 23, 2020 (KR) .......................... 10-2020-0157384

(51) Int. Cl.
*H01L 23/58* (2006.01)
*H01L 23/498* (2006.01)

(52) U.S. Cl.
CPC .. *H01L 23/49838* (2013.01); *H01L 23/49816* (2013.01); *H01L 23/49822* (2013.01); *H01L 23/585* (2013.01)

(58) Field of Classification Search
CPC .......................... H01L 23/585; H01L 23/49822
See application file for complete search history.

(56) References Cited

U.S. PATENT DOCUMENTS

| | | |
|---|---|---|
| 6,767,680 B2 | 7/2004 | Schulz |
| 9,070,560 B2 | 6/2015 | Abe et al. |
| 9,559,005 B2 | 1/2017 | Tsai et al. |
| 10,141,363 B2 | 11/2018 | Sekikawa |
| 10,643,958 B2 | 5/2020 | Kim et al. |
| 2018/0261467 A1* | 9/2018 | Matsumoto ........... H01L 21/768 |
| 2019/0304838 A1 | 10/2019 | Saeki et al. |
| 2022/0399311 A1* | 12/2022 | Heo ...................... H01L 21/561 |

FOREIGN PATENT DOCUMENTS

JP  2016027664  2/2016

* cited by examiner

*Primary Examiner* — Hoa B Trinh
(74) *Attorney, Agent, or Firm* — F. Chau & Associates, LLC

(57) ABSTRACT

A semiconductor device includes: a substrate including a semiconductor chip region, a guard ring region adjacent to the semiconductor chip region, and an edge region adjacent to the guard ring region; a first interlayer insulating layer disposed on the substrate; a wiring structure disposed inside the first interlayer insulating layer and in the guard ring region, wherein the wiring structure includes a first wiring layer and a second wiring layer disposed above the first wiring layer; and a trench configured to expose at least a part of the first interlayer insulating, layer in the edge region, wherein the trench includes a first bottom surface and a second bottom surface formed at a level different from that of the first bottom surface, wherein the first bottom surface is formed between the wiring structure and the second bottom surface, and the second bottom surface is formed adjacent to the first bottom surface.

20 Claims, 20 Drawing Sheets

FIG. 1
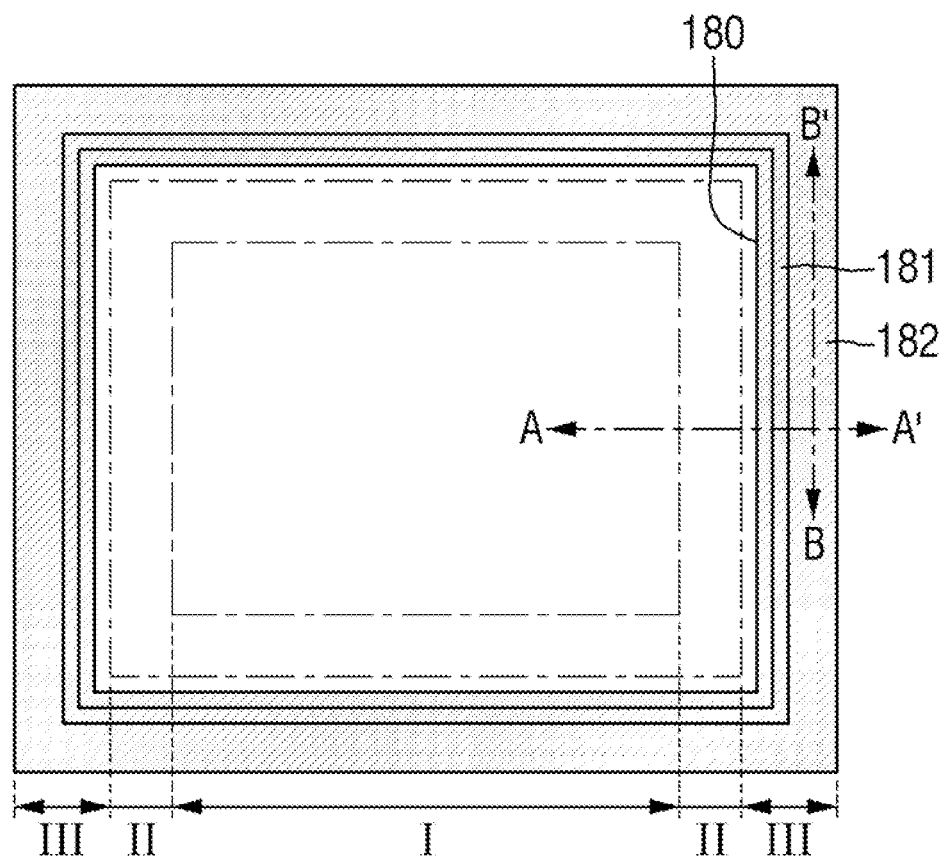
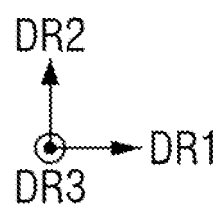

FIG. 17
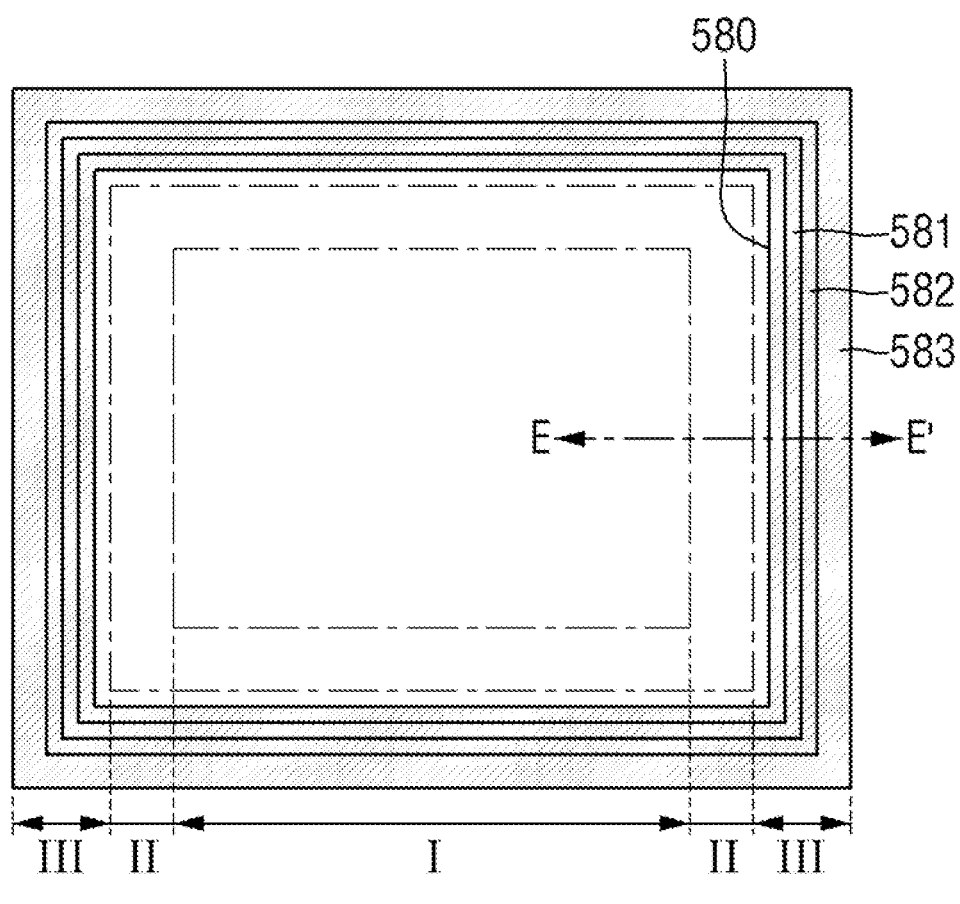
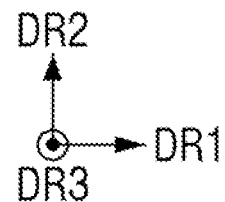

FIG. 20
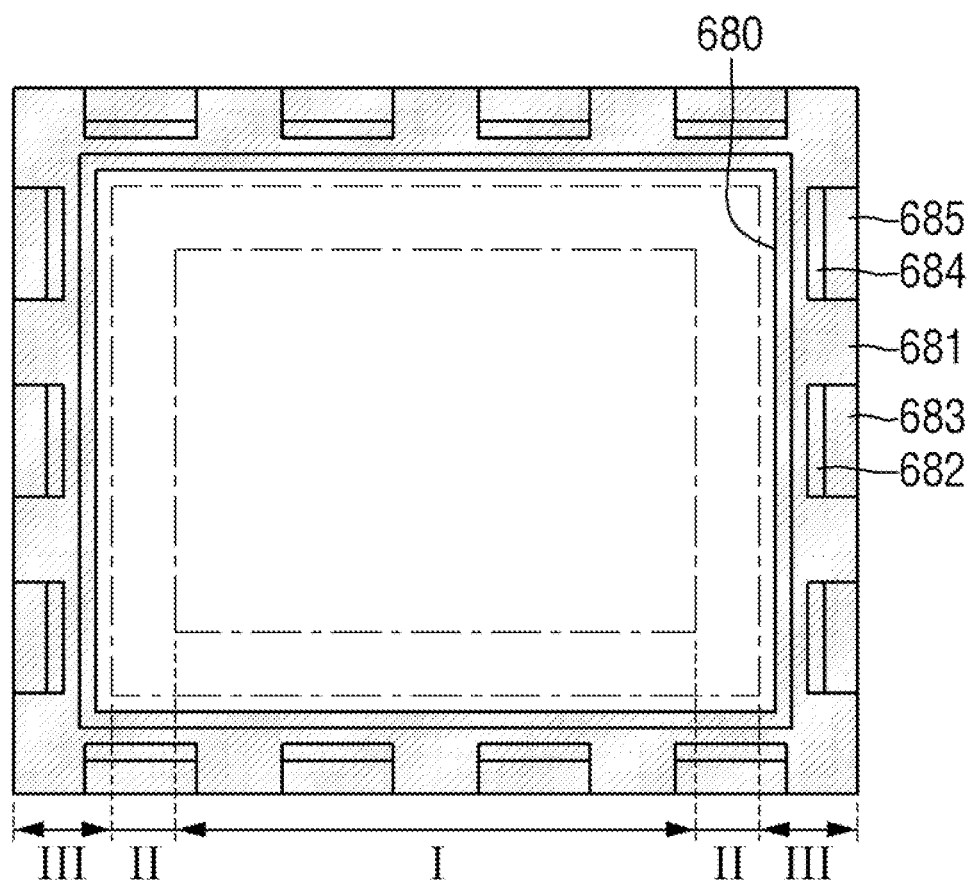
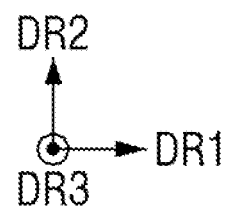

SEMICONDUCTOR DEVICE

CROSS-REFERENCE TO RELATED APPLICATION

This application claims priority under 35 U.S.C. § 119 to Korean Patent Application No. 10-2020-0157384 filed on Nov. 23, 2020 in the Korean Intellectual Property Office, the disclosure of Which is incorporated by reference herein in its entirety.

TECHNICAL FIELD

The present inventive concept relates to a semiconductor device.

DISCUSSION OF THE RELATED ART

When a semiconductor device is cut to package the semiconductor device, stress may occur in an edge region of the semiconductor device. Due to such stress, a crack may be formed in the edge region of the semiconductor device, which may result in deterioration the reliability of the semiconductor device.

SUMMARY

According to an exemplary embodiment of the present inventive concept, a semiconductor device includes: a substrate including a semiconductor chip region, a guard ring region at least partially surrounding the semiconductor chip region, and an edge region at least partially surrounding the guard dug region; a first interlayer insulating layer disposed on the substrate; a wiring structure disposed inside the first interlayer insulating layer and in the guard ring region, wherein the wiring structure includes a first wiring layer and a second Wiring layer disposed above a top surface of the first wiring layer; and a trench configured to expose at least a part of a sidewall of the first interlayer insulating layer in the edge region, wherein the trench includes a first bottom surface and a second bottom surface formed at a level different from that of the first bottom surface, wherein the first bottom surface of the trench is formed between the wiring structure and the second bottom surface of the trench, and the second bottom surface of the trench is formed adjacent to the first bottom surface of the trench in a first horizontal direction.

According to an exemplary embodiment of the present inventive concept, a semiconductor device includes a substrate including a semiconductor chip region and an edge region at least partially surrounding the semiconductor chip region; a first interlayer insulating layer disposed on the substrate; a conductive pad disposed on the first interlayer insulating layer and in the semiconductor chip region; a second interlayer insulating layer disposed on the first interlayer insulating layer and configured to expose at least a part of the conductive pad; a rewiring layer disposed on the second interlayer insulating layer and connected to the conductive pad; a solder ball connected to the rewiring layer; and a trench configured to expose at least a part of a sidewall of the first interlayer insulating layer and at least one sidewall of the second interlayer insulating layer in the edge region, wherein the trench includes a frit bottom surface and a second bottom surface formed lower than the first bottom surface, wherein the first bottom surface of the trench is formed between the semiconductor chip region and the second bottom surface of the trench, and the second bottom surface of the trench is formed adjacent to the first bottom surface of the trench in a first horizontal direction.

According to an exemplary embodiment of the present inventive concept, a semiconductor device includes: a substrate including a semiconductor chip region, a guard ring region at least partially surrounding the semiconductor chip region, and an edge region at least partially surrounding the guard ring region; a first interlayer insulating layer disposed on the substrate; a wiring structure disposed inside the first interlayer insulating layer and in the guard ring region, wherein the wiring structure includes a first wiring layer and a second wiring layer disposed on the first wiring layer; a conductive pad disposed on the first interlayer insulating layer in the semiconductor chip region; a second interlayer insulating layer disposed on the first interlayer insulating layer and configured to expose at least a part of the conductive pad; a rewiring layer disposed on the second interlayer insulating layer and connected to the conductive pad; and a trench configured to expose at least a pan of a sidewall of the first interlayer insulating layer and a sidewall of the second interlayer insulating layer in the edge region, wherein the trench includes a first bottom surface and a second bottom surface formed lower than the first bottom surface, wherein the first bottom surface of the trench is formed between the wiring structure and the second bottom surface of the trench, and the second bottom surface of the trench is formed adjacent to the first bottom surface of the trench in a first horizontal direction, the first bottom surface of the trench is formed on substantially the same plane as a top surface of the first wiring layer, and the second bottom surface of the trench is formed on substantially the same plane as a bottom surface of the first wiring layer.

BRIEF DESCRIPTION OF THE DRAWINGS

The above and other features of the present inventive concept will become more apparent by describing in detail exemplary embodiments thereof, with reference to the accompanying drawings, in which;

FIG. 1 is a schematic plan view illustrating a semiconductor device according to an exemplary embodiment of the present inventive concept;

FIGS. 6 to 10 are cross-sectional views taken along line F-F' of FIG. 5;

FIG. 17 is a schematic plan view illustrating a semiconductor device according to an exemplary embodiment of the present inventive concept;

FIG. 20 is a schematic plan view illustrating a semiconductor device according to an exemplary embodiment of the present inventive concept.

DETAILED DESCRIPTION OF THE EMBODIMENTS

Hereinafter, a semiconductor device according to an exemplary embodiment of the present inventive concept will be described with reference to FIGS. 1 to 4.

Figure 2:
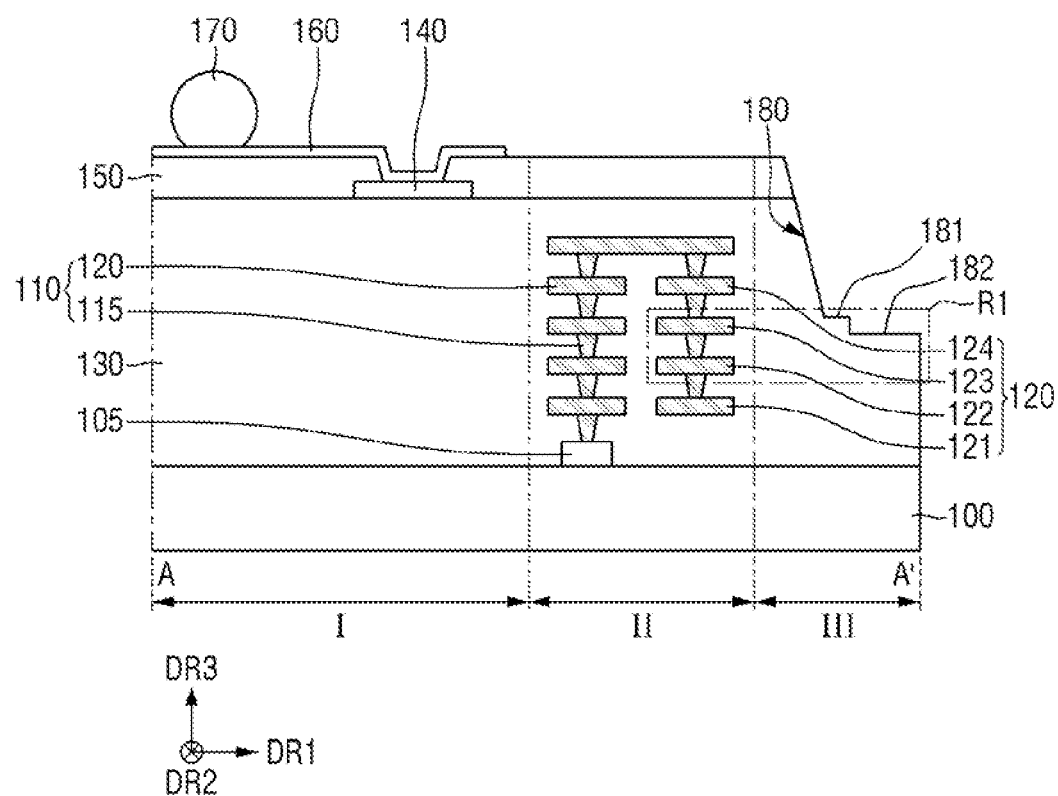
FIG. 2 is a cross-sectional view taken along line A-A' of FIG. 1.
Figure 3:
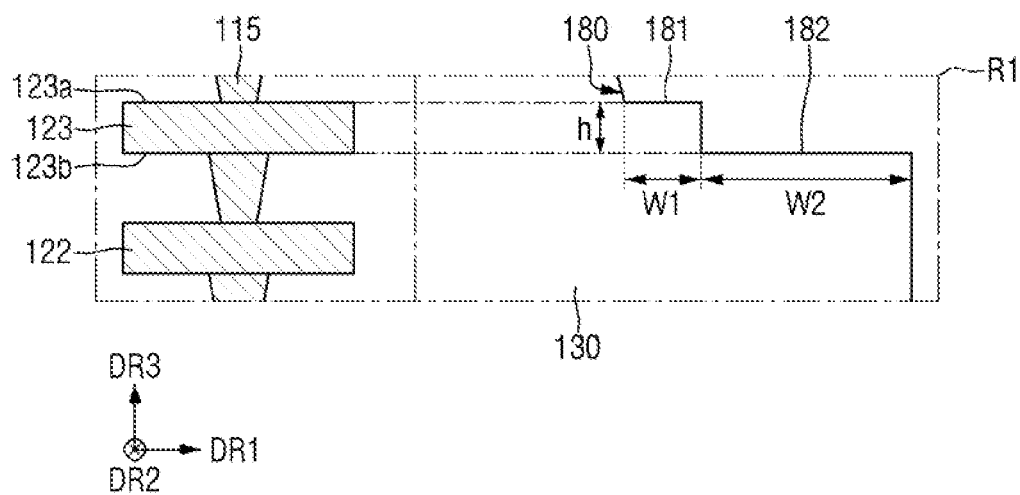
FIG. 3 is an enlarged view of area R1 of FIG. 2.
Figure 4:
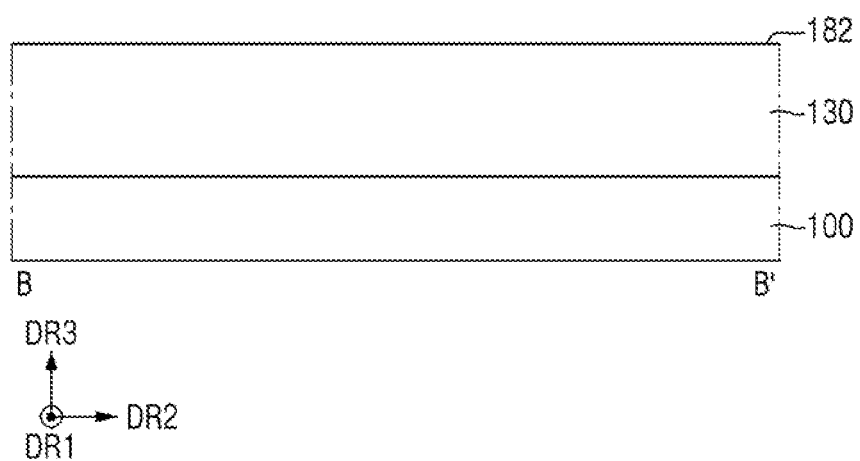
FIG. 4 is a cross-sectional view taken along line B-B' of FIG. 1.

FIG. 1 is a schematic plan view illustrating a semiconductor device according to an exemplary embodiment of the present inventive concept. FIG. 2 is a cross-sectional view taken along line A-A' of FIG. 1. FIG. 3 is an enlarged view of area R1 of FIG. 2. FIG. 4 is a cross-sectional view taken along line B-B' of FIG. 1.

Referring to FIGS. 1 to 4, a semiconductor device according to an exemplary embodiment of the present inventive concept includes a substrate 100, a wiring structure 110, a first interlayer insulating layer 130, a conductive pad 140, a second interlayer insulating layer 150, a rewiring layer 160, a solder ball 170, and a trench 180.

The substrate 100 may have a structure in which a base substrate and an epitaxial layer are stacked, but the present inventive concept is not limited thereto. The substrate 100 may be, for example, a silicon substrate, a gallium arsenide substrate, a silicon germanium substrate, a ceramic substrate, a quartz substrate, a glass substrate, or a semiconductor on insulator (SOI) substrate. In the present embodiment, a silicon substrate may be used as an example. Further, the substrate 100 may have a form in which the insulating layer is formed on the silicon substrate.

A semiconductor chip region I, a guard ring region II, and an edge region III may be provided in the substrate 100. A semiconductor chip may be disposed in the semiconductor chip region I. The semiconductor chip may be, for example, a memory chip, a logic chip, or the like. When the semiconductor chip is a logic chip, the semiconductor chip may be designed in various ways in consideration of operations to be performed. When the semiconductor chip is a memory chip, the memory chip may be, for example, a non-volatile memory chip. For example, the memory chip may be a flash memory chip. As an additional example, the memory chip may be either a NAND flash memory chip or a NOR flash memory chip. However, the type of the memory chip according to the present inventive concept is not limited thereto. In an exemplary embodiment of the present inventive concept, the memory chip may include any one of a phase-change random-access memory (PRAM), a magneto-resistive random-access memory (MRAM), and a resistive random-access memory (RRAM).

In addition, the semiconductor chip may include various types of individual elements. For example, the individual elements may include metal-oxide-semiconductor field-effect transistor (MOSFETs) such as complementary metal-oxide-semiconductor (CMOS) transistors, system large scale integration (LSI), image sensors such as CMOS image sensors (CIS), microelectromechanical systems (MEMS), and various other active and passive elements.

The guard ring region II may at least partially surround the side surface of the semiconductor chip region I on a plane defined by a first horizontal direction DR1 and a second horizontal direction DR2 substantially perpendicular to the first horizontal direction DR1. In FIG. 1, the guard ring region II is illustrated to completely surround the side surface of the semiconductor chip region I, but the present inventive concept is not limited thereto. In an exemplary embodiment of the present inventive concept, the guard ring region II may surround only a part of the side surface of the semiconductor chip region I.

The guard ring region II may block the propagation of physical cracks, which may occur in a sawing process, to the semiconductor chip region or may block the transfer of moisture through the cracks. In addition, when various abnormal electromagnetic interference (EMI), electro static discharge (ESD), and the like occur outside the semiconductor chip region I and flow in, the guard ring region II may receive them and discharge them back to the outside.

The edge region III may at least partially surround the side surface of the guard ring region II on a plane defined by the first horizontal direction DR1 and the second horizontal direction DR2.

A gate structure 105 may be disposed on the top surface of the substrate 100. The gate structure 105 may include, for example, a gate electrode and a gate insulating layer, The gate electrode may include, for example, at least one of titanium nitride (TiN) tantalum carbide (TaC), tantalum nitride (TaN) titanium silicon nitride (TiSiN), tantalum silicon nitride (TaSiN), tantalum titanium nitride (TaTiN), titanium aluminum nitride (TiAlN), tantalum aluminum nitride (TaAlN), tungsten nitride (WN), ruthenium (Ru), titanium aluminum (TiAl), titanium aluminum carbonitride (TiAlC-N), titanium aluminum carbide (TiAlC), titanium carbide (TiC), tantalum carbonitride (TaCN), tungsten (W), aluminum (Al), copper (Cu), cobalt (Co), titanium (Ti), tantalum (Ta), nickel (Ni), platinum (Pt), nickel platinum (Ni-Pt), niobium (Nb), niobium nitride (NbN), niobium carbide (NbC), molybdenum (Mo), molybdenum nitride (MoN), molybdenum carbide (MoC), tungsten carbide (WC), rhodium (Rh), palladium (Pd), iridium (Ir), osmium (Os), silver (Ag), gold (Au), zinc (Zn), vanadium (V) or a combination thereof.

The gate insulating layer may include silicon oxide, silicon nitride, silicon oxynitride, or a high-k material baying a higher dielectric constant than silicon oxide. The high-k material may include, for example, at least one of hafnium oxide, hafnium silicon oxide, hafnium aluminum oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate, or a combination thereof.

The first interlayer insulating layer 130 may be disposed on the substrate 100. For example, the first interlayer insulating layer 130 may be disposed on the top surface of the substrate 100. The first interlayer insulating layer 130 may be disposed to cover the gate structure 105. The first interlayer insulating layer 130 may include, for example, at least one of a silicon oxide layer, a silicon nitride layer, a silicon oxynitride layer, or a combination thereof, but the present inventive concept is not limited thereto.

The wiring structure 110 may be disposed inside the first interlayer insulating layer 130 in the guard ring region II. The wiring structure 110 may include a plurality of wiring layers 120 and a plurality of vias 115.

The plurality of wiring layers 120 may include a plurality of wiring layers spaced apart from each other in a vertical direction DR3 substantially perpendicular to the first and second horizontal directions DR1 and DR2. The plurality of wiring layers 120 may include, for example, first to fourth wiring layers 121, 122, 123, and 124.

The first to fourth wiring layers 121, 122, 123, and 124 may be sequentially disposed to be spaced apart from each other above the top surface of the substrate 100 in the guard ring region II. For example, the second wiring layer 122 may be disposed above the top surface of the first wiring layer 121, and the third wiring layer 123 may be disposed above the top surface of the second wiring layer 122. In addition, the fourth wiring layer 124 may be disposed above a top surface 123a of the third wiring layer 123.

The plurality of wiring layers 120 may include, for example, wiring layers respectively disposed on the same levels as the first to fourth wiring layers 121, 122, 123, and 124, and between the semiconductor chip region I and the first to fourth wiring layers 121, 122, 123, and 124. The wiring layers disposed between the semiconductor chip region I and the first to fourth wiring layers 121, 122, 123, and 124 may be sequentially disposed to be spaced apart from each other in the vertical direction DR3 above the gate structure 105.

The plurality of vias 115 may be disposed between the plurality of wiring layers 120. The plurality of wiring layers 120 may be electrically connected to each other through the plurality of vias 115. The plurality of wiring layers 120 and the plurality of vias 115 may include, for example, aluminum, but the present inventive concept is not limited thereto. In an exemplary embodiment of the present inventive concept, the plurality of wiring layers 120 and the plurality of vias 115 may include, for example, at least one of a metal such as copper, tungsten, nickel, cobalt, or tantalum, a metal silicide such as tungsten silicide, nickel silicide, cobalt silicide, or tantalum silicide, impurity-doped polysilicon, or a combination thereof.

The conductive pad 140 may be disposed on the first interlayer insulating layer 130 in the semiconductor chip region I. The conductive pad 140 may include a conductive material.

The second interlayer insulating layer 150 may be disposed on the first interlayer insulating layer 130. The second interlayer insulating layer 150 may be disposed to cover the first interlayer insulating layer 130. The second interlayer insulating layer 150 may expose at least a part of the conductive pad 140. For example, the second interlayer insulating layer 150 may include a hole exposing the conductive pad 140.

Although it is depicted in FIG. 2 that the second interlayer insulating layer 150 is formed as a single layer, the present inventive concept is not limited thereto. In an exemplary embodiment of the present inventive concept, the second interlayer insulating layer 150 may be formed of multiple layers. The second interlayer insulating layer 150 may include an insulating material.

The rewiring layer 160 may be disposed on the second interlayer insulating layer 150 in the semiconductor chip region I. The rewiring layer 160 may be connected to the conductive pad 140 exposed from the second interlayer insulating layer 150.

The rewiring layer 160 may include, for example, at least one of copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), and carbon (C), or an alloy thereof.

The solder ball 170 may be disposed on the rewiring layer 160 in the semiconductor chip region I. The solder ball 170 may convexly protrude from the rewiring layer 160 in the vertical direction DIU. For example, the solder ball 170 may have a rounded shape. The semiconductor device may be electrically connected to an external device through the solder ball 170. The solder ball 170 may include, for example, tin (Sn), indium (In), bismuth (Bi), antimony (Sb), copper (Cu), aluminum (Al), silver (Ag), zinc (Zn), lead (Pb) and/or an alloy thereof. For example, the solder ball 170 may include Sn, Pb, Sn—Pb Sn—Ag, Sn—Cu, Sn—Bi, Sn—Zn, Sn—Ag—Cu, Sn—Ag—Bi, Sn—Ag—Zn, Sn—Cu—Bi, Sn—Cu—Zn, Sn—Bi—Zn, or the like.

The trench 180 may be formed in the edge region III. The trench 180 may be, for example, integrally formed to at least partially surround the side surface of the guard ring region II. For example, the trench 180 may completely surround the side surface of the guard ring region II. The trench 180 may expose at least a part of the sidewall of the first interlayer insulating layer 130. In addition, the trench 180 may expose the sidewall of the second interlayer insulating layer 150. For example, the trench 180 may expose at least one sidewall of the second interlayer insulating layer 150.

The trench 180 may include a first bottom surface 181 and a second bottom surface 182 being at a level different from which the first bottom surface 181 is located at. For example, the second bottom surface 182 may be lower than the first bottom surface 181. The fast interlayer insulating layer 130 may be exposed through each of the first bottom surface 181 of the trench 180 and the second bottom surface 182 of the trench 180.

The first bottom surface 181 of the trench 180 may be formed between the wiring structure 110 and the second bottom surface 182 of the trench 180. For example, the second bottom surface 182 of the trench 180 may be formed adjacent to the first bottom surface 181 of the trench 180 in the first horizontal direction DR1.

The second bottom surface 182 of the trench 180 may be formed lower than the first bottom surface 181 of the trench 180. For example, the second bottom surface 182 of the trench 180 may be formed closer to the top surface of the substrate 100 than the first bottom surface 181 of the trench 180.

The first bottom surface 181 of the trench 180 and the second bottom surface 182 of the trench 180 may be formed respectively on the same plane as the top and bottom surfaces of any one of the plurality of wiring layers 120 included in the wiring structure 110. For example, the first bottom surface 181 of the trench 180 may be formed on the same plane as the top surface 123a of the third wiring layer 123. In addition, the second bottom surface 182 of the trench 180 may be formed on the same plane as a bottom surface 123b of the third wiring layer 123.

For example, a width W2 of the first bottom surface 181 of the trench 180 in the first horizontal direction DR2 may be smaller than a width W2 of the second bottom surface 182 of the trench 180 in the first horizontal direction DR1. The width W2 of the first bottom surface 181 of the trench 180 in the first horizontal direction DR2 may be, for example, about 0.1 μm to about 5 μm. The width W2 of the second bottom surface 182 of the trench 180 in the first horizontal direction DR1 may be, for example, about 0.1 μm to about 10 μm.

A height h in the vertical direction DR3 from the second bottom surface 182 of the trench 180 to the first bottom surface 181 of the trench 180 may be, for example, about 0.1 μm to about 5 μm. The second bottom surface 182 of the trench 180 may be connected to the outermost sidewall of the first interlayer insulating layer 130 disposed in the edge region III. For example, the outermost sidewall of the first interlayer insulating layer 130 may between the first bottom surface 181 and the second bottom surface 182.

Hereinafter, a method for fabricating a semiconductor device according to an exemplary embodiment of the present inventive concept will be described with reference to FIGS. 5 to 10.

FIGS. 5 to 10 are diagrams illustrating intermediate steps of a method for fabricating a semiconductor device according to an exemplary embodiment of the present inventive concept. FIGS. 6 to 10 are cross-sectional views taken along line F-F' of FIG. 5.

Figure 5:
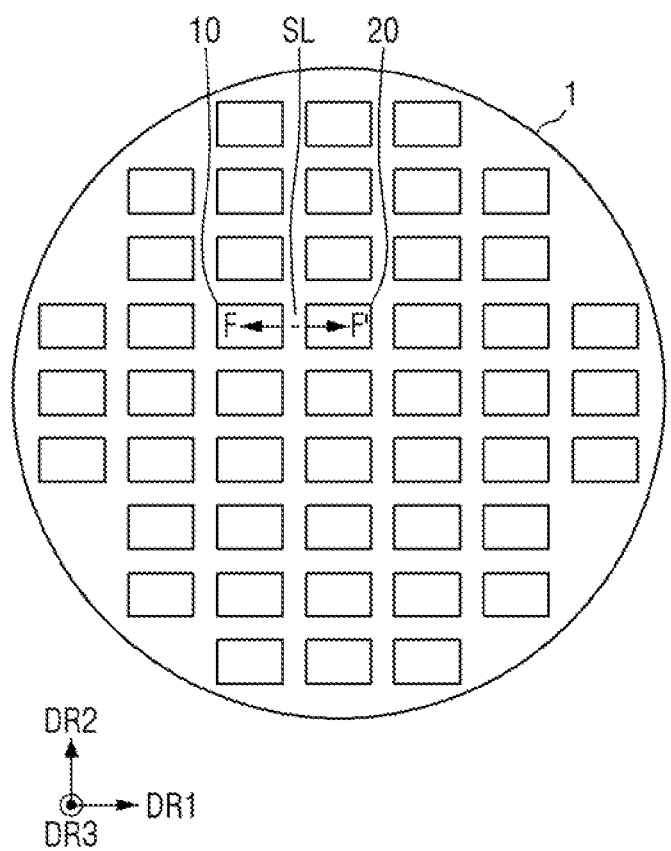
FIGS. 5, 6, 7, 8, 9 and 10 are diagrams illustrating intermediate steps of a method for fabricating a semiconductor device according to an exemplary embodiment of the present inventive concept.

Referring to FIG. 5, a plurality of semiconductor chips may be disposed on a wafer 1. The plurality of semiconductor chips may be disposed to be spaced apart from each other in each of the first horizontal direction DR1 and the second horizontal direction DR2. Scribe lines may be arranged to surround each of the plurality of semiconductor chips on the wafer 1.

For example, a first semiconductor chip 10 and a second semiconductor chip 20 may be spaced apart from each other in the first horizontal direction DR1. A scribe line SL may be disposed between the first semiconductor chip 10 and the second semiconductor chip 20.

Figure 6:
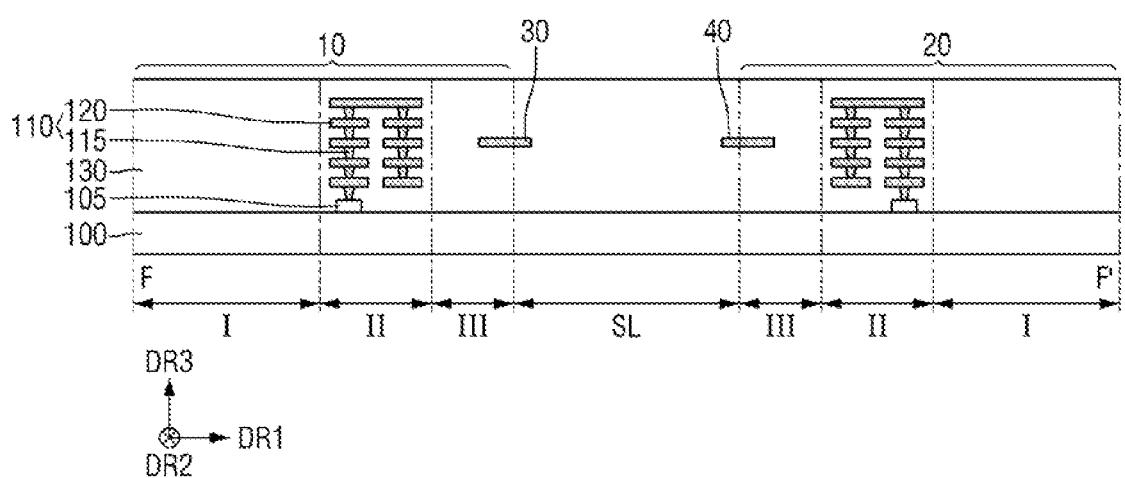

Referring to FIG. 6, the substrate 100, in which the semiconductor chip region I, the guard ring region II, and the edge region III are provided, may be included in each of the first and second semiconductor chips 10 and 20. The substrate 100 may also be formed in the scribe line SL.

Subsequently, the gate structure 105, the wiring structure 110, a first sacrificial metal layer 30, a second sacrificial metal layer 40, and the first interlayer insulating layer 130 may be formed on the substrate 100.

The gate structure 105 may be formed in the guard ring region 11 of each of the first and second semiconductor chips 10 and 20. The wiring structure 110 may be formed on the gate structure 105 in the guard ring region II of each of the first and second semiconductor chips 10 and 20.

The first sacrificial metal layer 30 may be formed over the edge region III of the first semiconductor chip 10 and the scribe line SL. The second sacrificial metal layer 40 may be formed over the edge region III of the second semiconductor chip 20 and the scribe line SL.

The first sacrificial metal layer 30 may be formed at the same level as any one wiring layer included in the wiring structure 110 funned in the guard ring region II of the first semiconductor chip 10. Further, the second sacrificial metal layer 40 may be formed at the same level as any one wiring layer included in the wiring structure 110 formed in the guard ring region II of the second semiconductor chip 20. For example, each of the first sacrificial metal layer 30 and the second sacrificial metal layer 40 may be formed at the same level as the third wiring layer 123 shown in FIG. 6. For example, each of the first sacrificial metal layer 30 and the second sacrificial metal layer 40 may be formed through the same fabricating process as the third wiring layer 123. However, the present inventive concept is not limited thereto.

Each of the first sacrificial metal layer 30 and the second sacrificial metal layer 40 may include a metal aluminum (Al), For example, each of the first sacrificial metal layer 30 and the second sacrificial metal layer 40 may include the same material as the plurality of wiring layers 120. Each of the first sacrificial metal layer 30 and the second sacrificial metal layer 40 may include, for example, at least one of a metal such as copper, tungsten, nickel, cobalt, or tantalum, a metal silicide such as tungsten silicide, nickel silicide, cobalt silicide, or tantalum silicide, impurity-doped polysilicon, and a combination thereof.

The first interlayer insulating layer 130 may be formed on the top surface of the substrate 100 to cover each of the gate structure 105, the wiring structure 110, the first sacrificial metal layer 30, and the second sacrificial metal layer 40.

Figure 7:
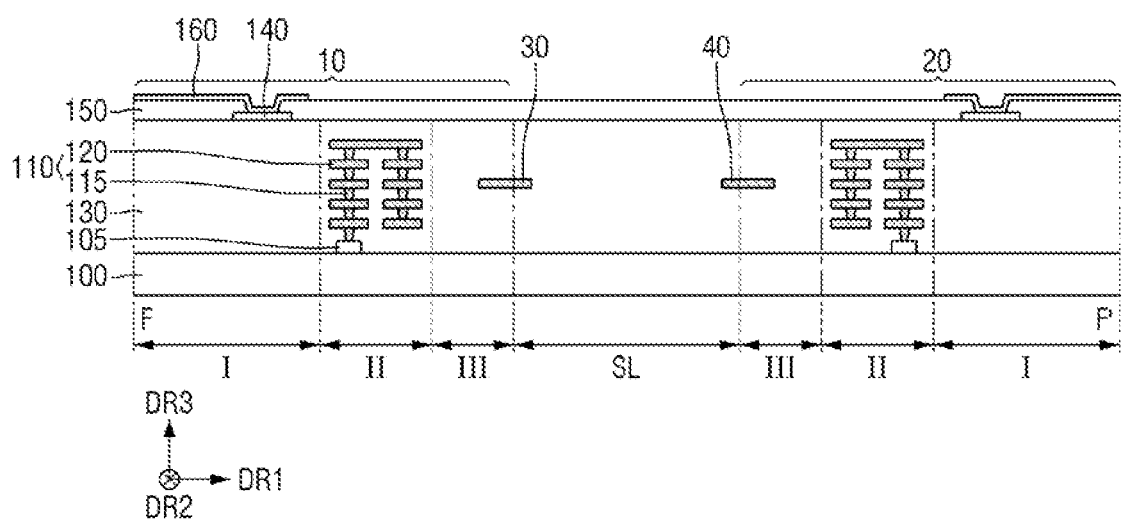

Referring to FIG. 7, the conductive pad 140 may be formed in the semiconductor chip region I of each of the first and second semiconductor chips 10 and 20. Subsequently, the second interlayer insulating layer 150 may be formed on the first interlayer insulating layer 130. At least a part of the conductive pad 140 may be exposed from the second interlayer insulating layer 150.

Figure 8:
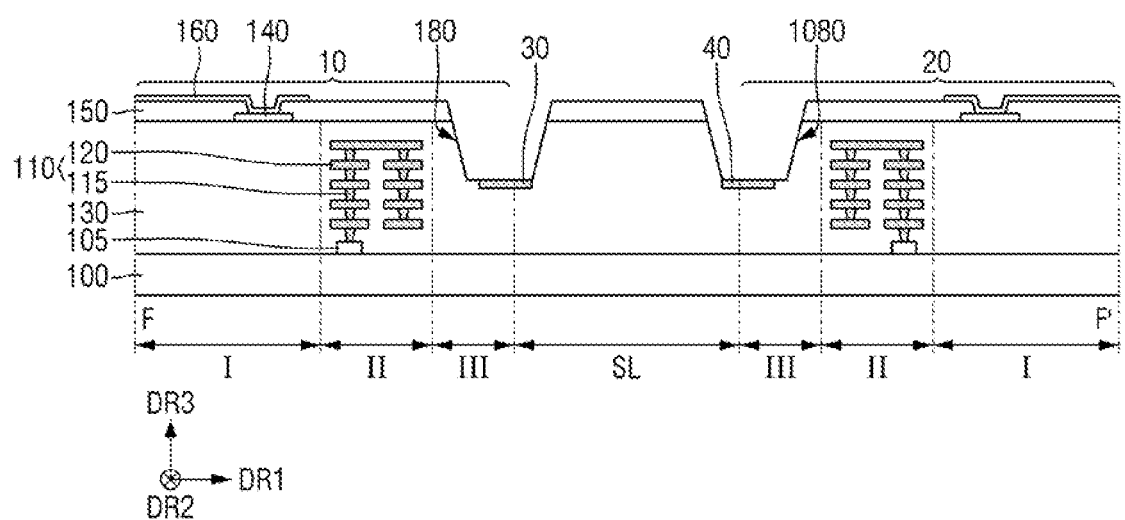

Subsequently, the rewiring layer 160 may be formed in the semiconductor chip region I of each of the first and second semiconductor chips 10 and 20, The rewiring layer 160 may be connected to the conductive pad 140. &p Referring to FIG. 8, a first trench 180 may be formed in the edge region III of the first semiconductor chip 10 and the scribe line SL. In addition, a second trench 1080 may be formed in the edge region III of the second semiconductor chip 20 and the scribe line SL.

The first trench 180 may be formed to expose the top surface of the first sacrificial metal layer 30. For example, the bottom surface of the first trench 180 may he formed on the same plane as the top surface of the first sacrificial metal layer 30. In addition, the second trench 1080 may be formed to expose the top surface of the second sacrificial metal layer 40. For example, the bottom surface of the second trench 1080 may be formed on the same plane as the top surface of the second sacrificial metal layer 40.

Figure 9:
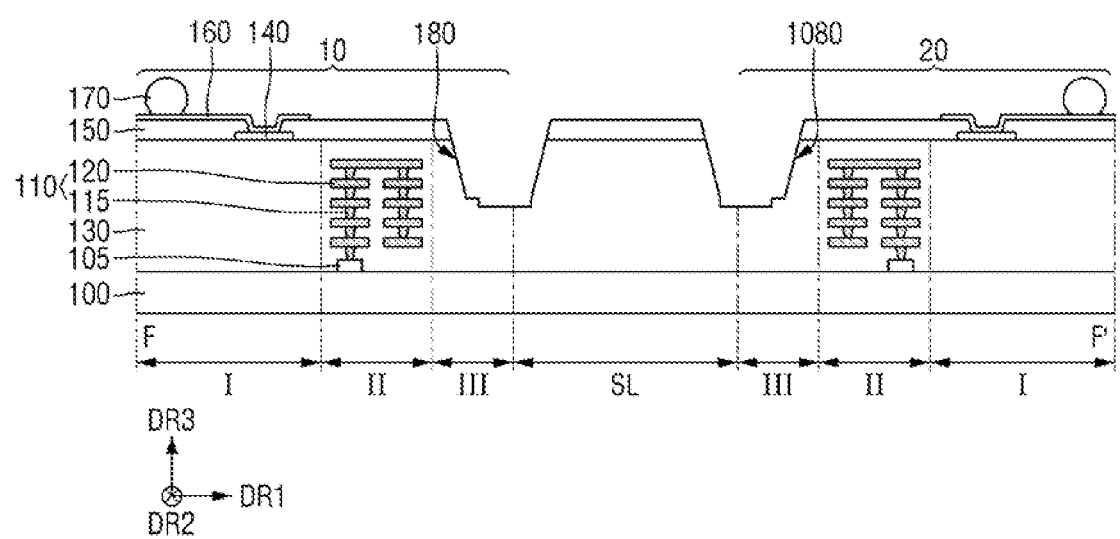

Referring to FIG. 9, each of the first sacrificial metal layer 30 and the second sacrificial metal layer 40 may be removed. Subsequently, the solder ball 170 may be formed on the rewiring layer 160 of each of the first and second semiconductor chips 10 and 20. However, the present inventive concept is not limited thereto. In an exemplary embodiment of the present inventive concept, after the solder ball 170 is formed on the rewiring layer 160 of each of the first and second semiconductor chips 10 and 20, the first sacrificial metal layer 30 and the second sacrificial metal layer 40 may each be removed.

Figure 10:
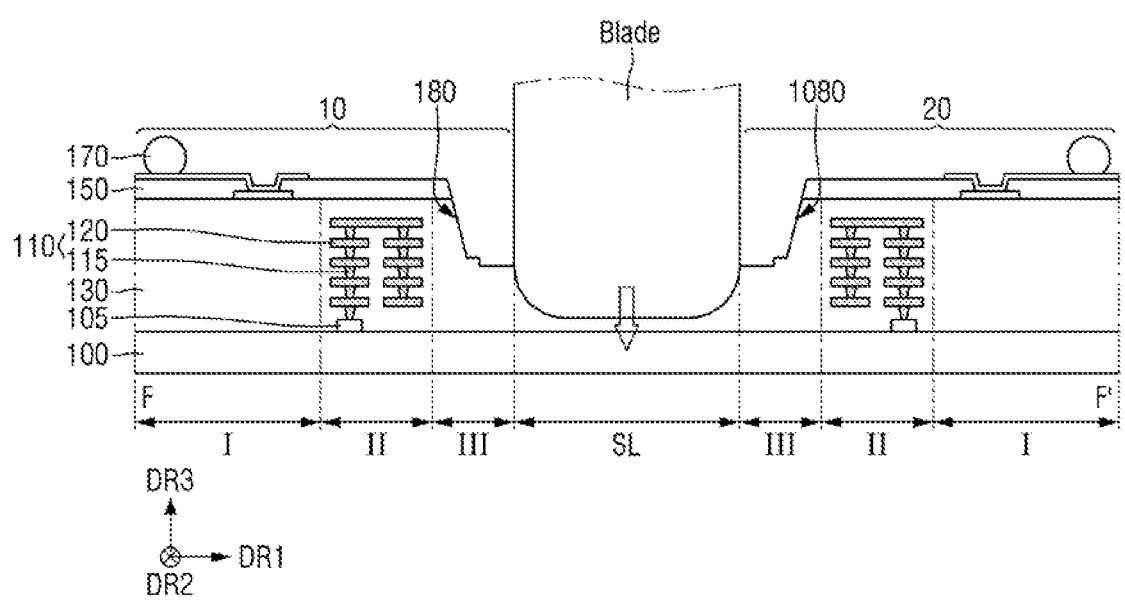

Referring to FIG. 10, the scribe line SL may be cut through, for example, a sawing process using a blade. In this case, a part of the first trench 180 adjacent to the scribe line SL and a part of the second trench 1080 adjacent to the scribe line SL may each be removed. For example, the part of the first trench 180 that is removed may be in the scribe line SL, and the part of the second trench 1080 that is removed may be in the scribe line SL. Through this process, the semiconductor device shown in FIG. 2 may be fabricated.

In the semiconductor device and the method for fabricating the semiconductor device according to an exemplary embodiment of the present inventive concept, by forming the bottom surface of the trench 180 formed in the scribe line SL to have a level difference, it is possible to prevent the guard ring region II from being removed during the sawing process.

Figure 11:
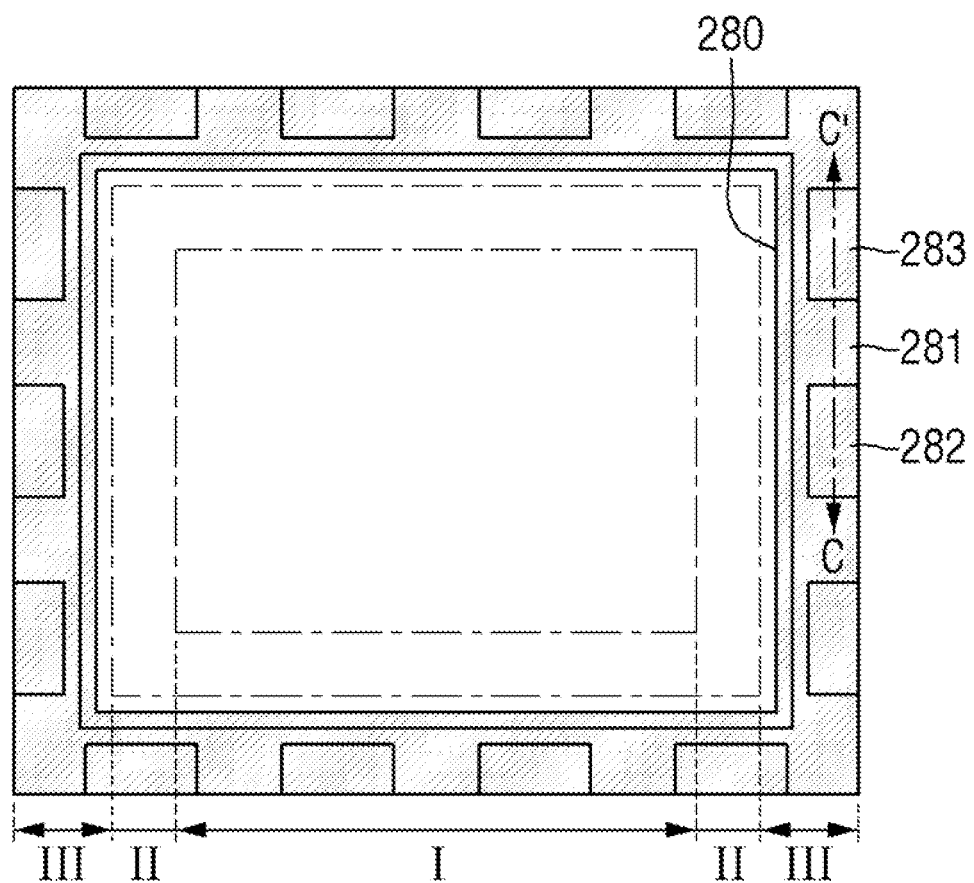
FIG. 11 is a schematic plan view illustrating a semiconductor device according to an exemplary embodiment of the present inventive concept.
Figure 12:
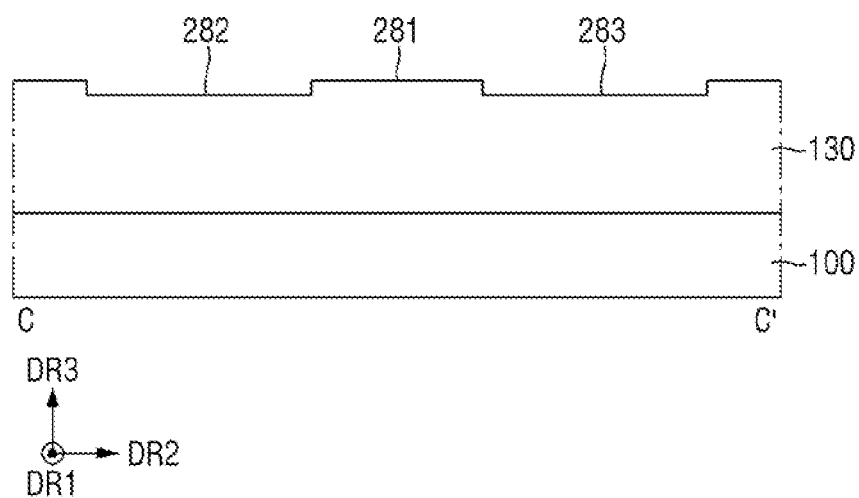
FIG. 12 is a cross-sectional view taken along line C-C' of FIG. 11.

Hereinafter, a semiconductor device according to an exemplary embodiment of the present inventive concept will be described with reference to FIGS. 11 and 12. With reference to FIGS. 11 and 12, differences from the semiconductor device shown in FIGS. 1 to 4 will be mainly described.

FIG. 11 is a schematic plan view illustrating a semiconductor device according to an exemplary embodiment of the present inventive concept. FIG. 12 is a cross-sectional view taken along line C-C of FIG. 11.

Referring to FIGS. 11 and 12, in a semiconductor device according to an exemplary embodiment of the present inventive concept, a trench 280 may include a first bottom surface 281 and a plurality of bottom surfaces formed lower than the first bottom surface 281 and formed spaced apart from each other. For example, the plurality of bottom surfaces formed lower than the first bottom surface 281 may be spaced apart from each other in each of the first horizontal direction. DR1 and the second horizontal direction DR2.

For example, the trench 280 may include the first bottom surface 281, a second bottom surface 282, and a third bottom surface 283. The third bottom surface 283 of the trench 280 may be spaced apart from the second bottom surface 282 of the trench 280 in the second horizontal direction DR2. The first bottom surface 281 of the trench 280 may be formed between the third bottom surface 283 of the trench 280 and the second bottom surface 282 of the trench 280. The third bottom surface 283 of the trench 280 may be formed on substantially the same plane as the second bottom surface 282 of the trench 280. However, the present inventive concept is not limited thereto. For example, the third bottom surface 283 of the trench 280 may be formed at a level different from that of the second bottom surface 282 of the trench 280.

Figure 13:
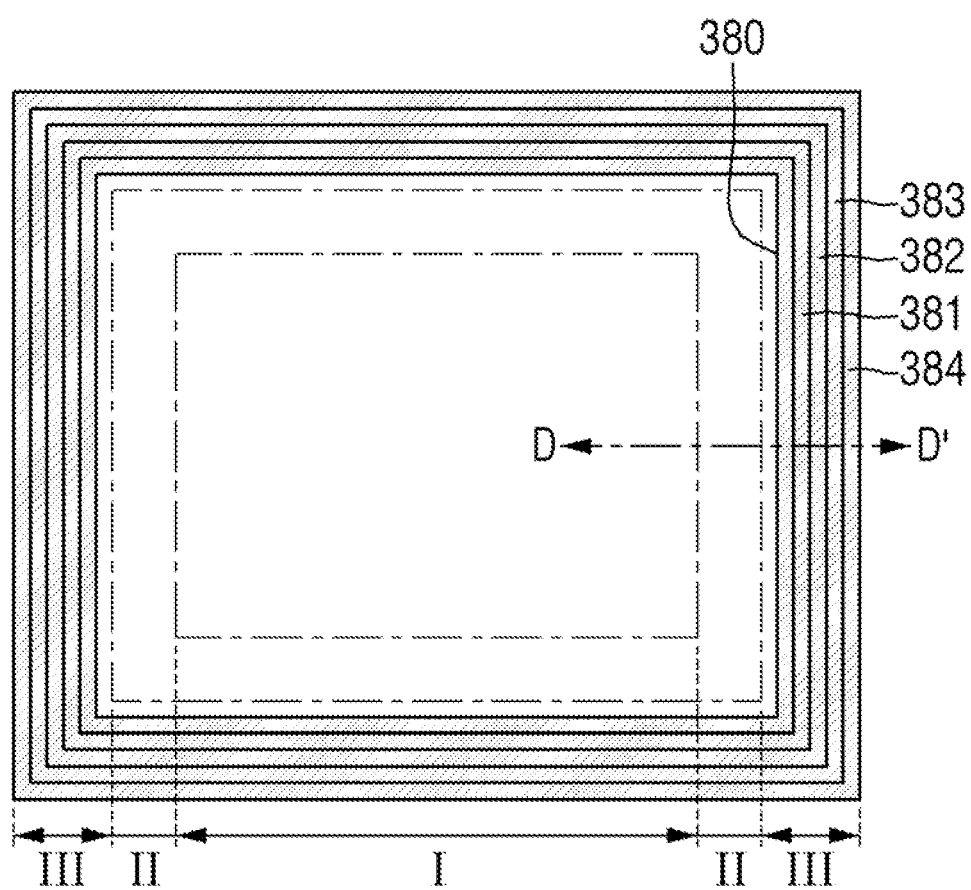
FIG. 13 is a schematic plan view illustrating a semiconductor device according to an exemplary embodiment of the present inventive concept.

Hereinafter, a semiconductor device according to an exemplary embodiment of the present inventive concept will be described with reference to FIGS. 13 to 15. With reference to FIGS. 13 and 15, differences from the semiconductor device shown in FIGS. 2 to 4 will be mainly described.

FIG. 13 is a schematic plan view illustrating a semiconductor device according to an embodiment of the present inventive concept. FIG. 14 is a cross-sectional view taken along line D-D' of FIG. 13. FIG. 15 is an enlarged view of area R2 of FIG. 14.

Figure 14:
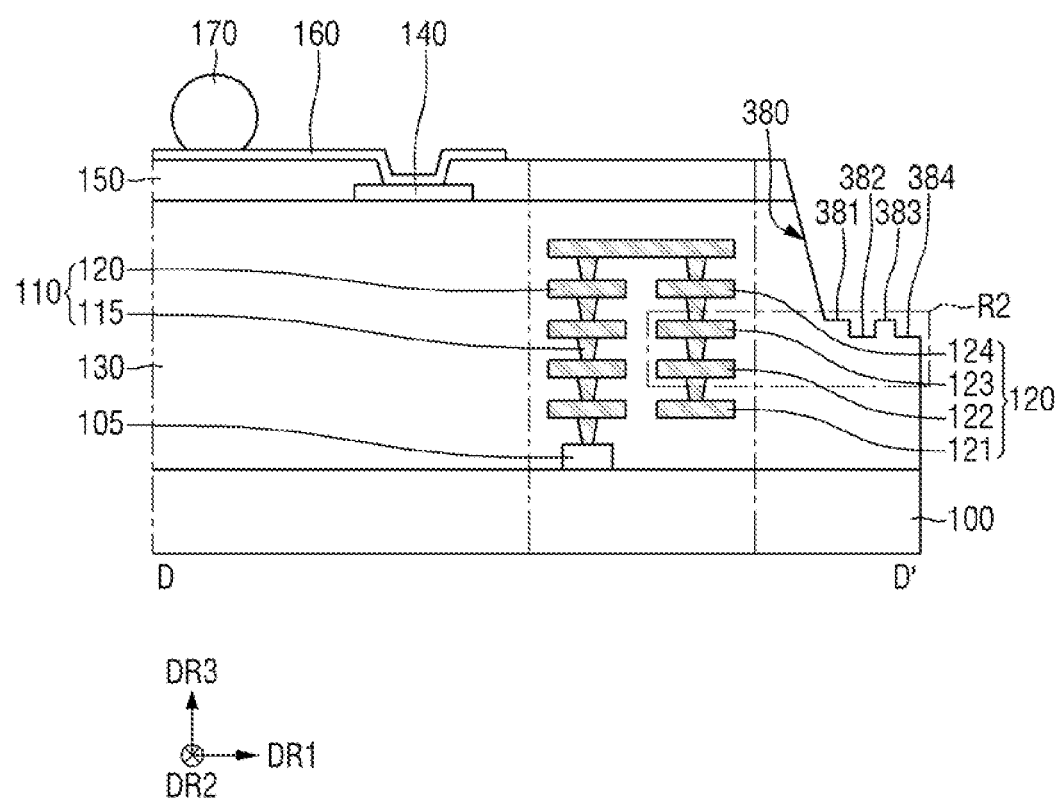
FIG. 14 is a cross-sectional view taken along line D-D' of FIG. 13.
Figure 15:
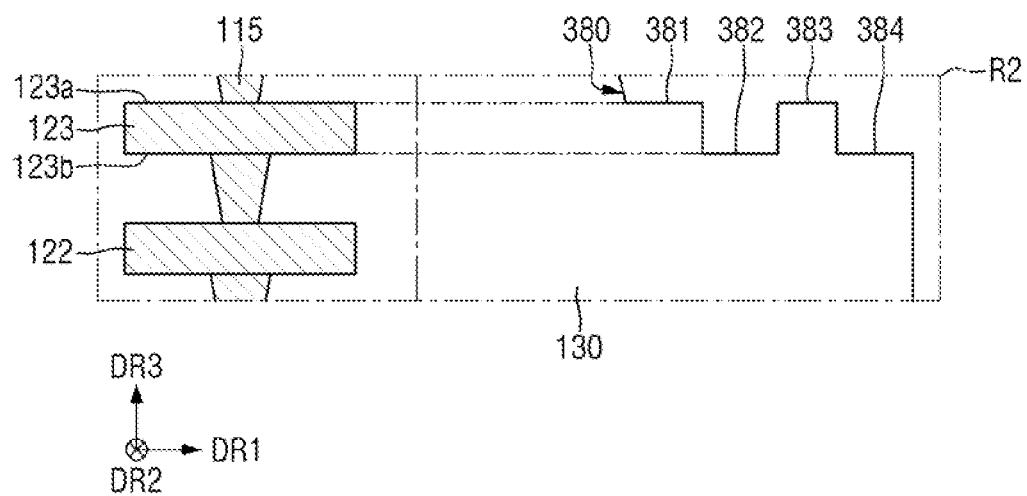
FIG. 15 is an enlarged view of area R2 of FIG. 14.

Referring to FIGS. 13 to 15, in a semiconductor device according to an exemplary embodiment of the present inventive concept, a trench 380 may include a plurality of bottom surfaces having a level difference. For example, the plurality of bottom surfaces may have different heights. As an additional example, the lower surface of the trench 380 may be an uneven surface.

For example, the trench 380 may include first to fourth bottom surfaces 381, 382, 383, and 384. The second bottom surface 382 of the trench 380 may be formed adjacent to the first bottom surface 381 of the trench 380 in the first horizontal direction DR1. The third bottom surface 383 of the trench 380 may be formed adjacent to the second bottom surface 382 of the trench 380 in the first horizontal direction DR1. The fourth bottom surface 384 of the trench 380 may be formed adjacent to the third bottom surface 383 of the trench 380 in the first horizontal direction DR1.

Each of the second bottom surface 382 of the trench 380 and the fourth bottom surface 384 of the trench 380 may be formed lower than each of the first bottom surface 381 of the trench 380 and the third bottom surface 383 of the trench 380. Each of the second bottom surface 382 of the trench 380 and the fourth bottom surface 384 of the trench 380 may be integrally formed to at least partially surround the guard ring region II. For example, each of the second bottom surface 382 of the trench 380 and the fourth bottom surface 384 of the trench 380 may completely surround the guard ring region II.

The first bottom surface 381 of the trench 380 and the third bottom surface 383 of the trench 380 may be formed on substantially the same plane. For example, each of the first bottom surface 381 of the trench 380 and the third bottom surface 383 of the trench 380 may be formed on substantially the same plane as the top surface 123a of the third wiring layer 123.

The second bottom surface 382 of the trench 380 and the fourth bottom surface 384 of the trench 380 may be formed on substantially the same plane. For example, each of the second bottom surface 382 of the trench 380 and the fourth bottom surface 384 of the trench 380 may be formed on substantially the same plane as the bottom surface 123b of the third wiring layer 123.

Hereinafter, a semiconductor device according to an exemplary embodiment of the present inventive concept will be described with reference to FIG. 16. With regard to FIG. 16, differences from the semiconductor device shown in FIGS. 13 to 15 will be mainly described.

Figure 16:
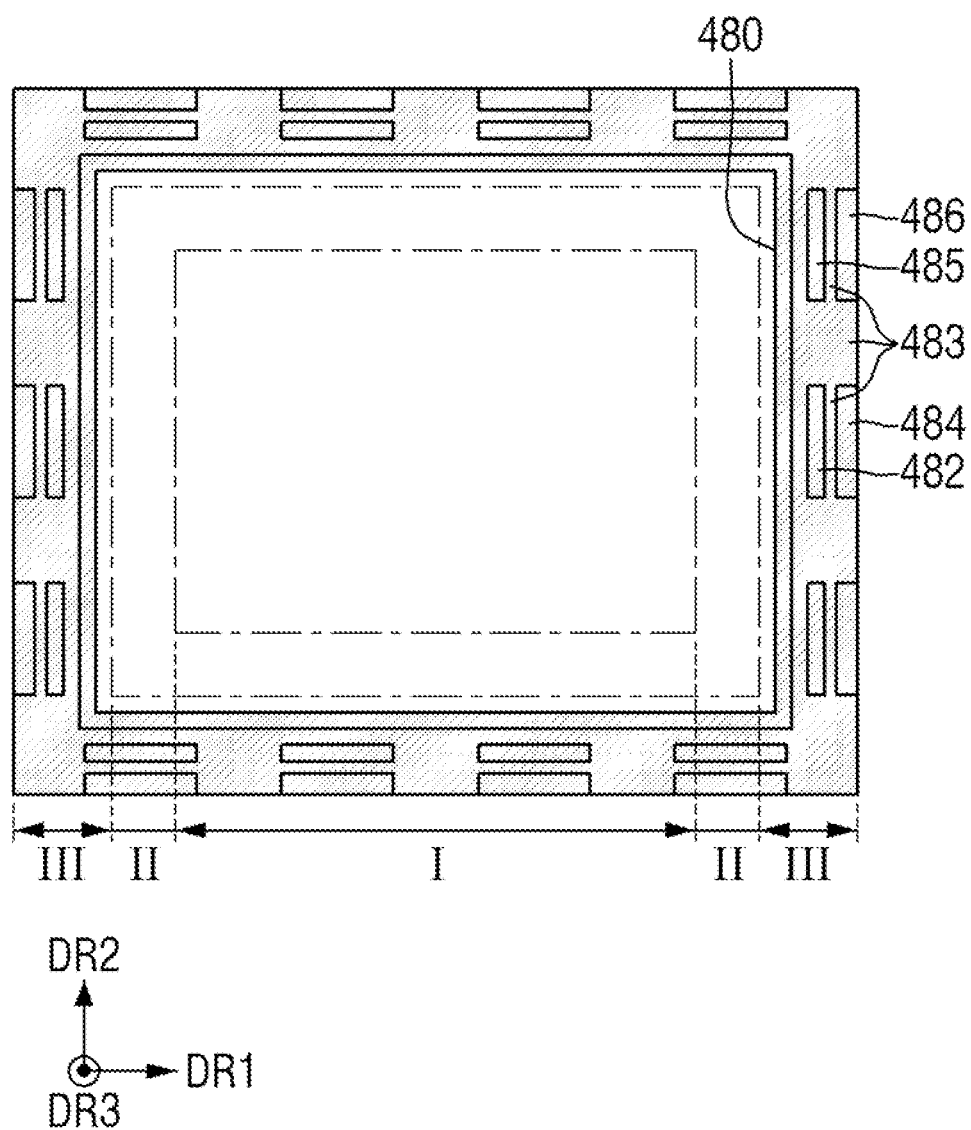
FIG. 16 is a schematic plan view illustrating a semiconductor device according to an exemplary embodiment of the present inventive concept.

FIG. 16 is a schematic plan view illustrating a semiconductor device according to an exemplary embodiment of the present inventive concept.

Referring to FIG. 16, in a semiconductor device according to an exemplary embodiment of the present inventive concept, a trench 480 may include a plurality of bottom surfaces having a level difference, and spaced apart from each other. For example, the plurality of bottom surfaces may have different heights.

For example, the trench 480 may include first to sixth bottom surfaces 381, 482, 483, 484, 485, and 486 (see FIGS. 15 and 16). The fourth bottom surface 484 of the trench 480 may be spaced apart from the second bottom surface 482 of the trench 480 in the first horizontal direction DR1. The third bottom surface 483 of the trench 480 may be formed between the fourth bottom surface 484 of the trench 480 and the second bottom surface 482 of the trench 480. The sixth bottom surface 486 of the trench 480 may be spaced apart from the fifth bottom surface 485 of the trench 480 in the first horizontal direction DR1. The third bottom surface 483 of the trench 480 may be formed between the sixth bottom surface 485 of the trench 480 and the fifth bottom surface 485 of the trench 480.

The fifth bottom surface 485 of the trench 480 may he spaced apart from the second bottom surface 482 of the trench 480 in the second horizontal direction DR2. The third bottom surface 483 of the trench 480 may be formed between the second bottom surface 482 of the trench 480 and the fifth bottom surface 485 of the trench 480. The sixth bottom surface 486 of the trench 480 may be spaced apart from the fourth bottom surface 484 of the trench 480 in the second horizontal direction DR2. The third bottom surface 483 of the trench 480 may be formed between the sixth bottom surface 485 of the trench 480 and the fourth bottom surface 484 of the trench 480.

The third bottom surface 483 of the trench 480 may be formed on substantially the same plane as the first bottom surface 381 (see FIG. 15) of the trench 480. The second bottom surface 482 of the trench 480, the fourth bottom surface 484 of the trench 480, the fifth bottom surface 485 of the trench 480, and the sixth bottom surface 486 of the trench 480 may be formed on substantially the same plane.

Hereinafter, a semiconductor device according to an exemplary embodiment of the present inventive concept will be described with reference to FIGS. 17 to 19. With regard to FIGS. 17 to 19 differences from the semiconductor device shown in FIGS. 1 to 4 will be mainly described.

FIG. 17 is a schematic plan view illustrating a semiconductor device according to an exemplary embodiment of the present inventive concept. FIG. 18 is a cross-sectional view taken along line E-E' of FIG. 17. FIG. 19 is an enlarged view of area R3 of FIG. 18.

Figure 18:
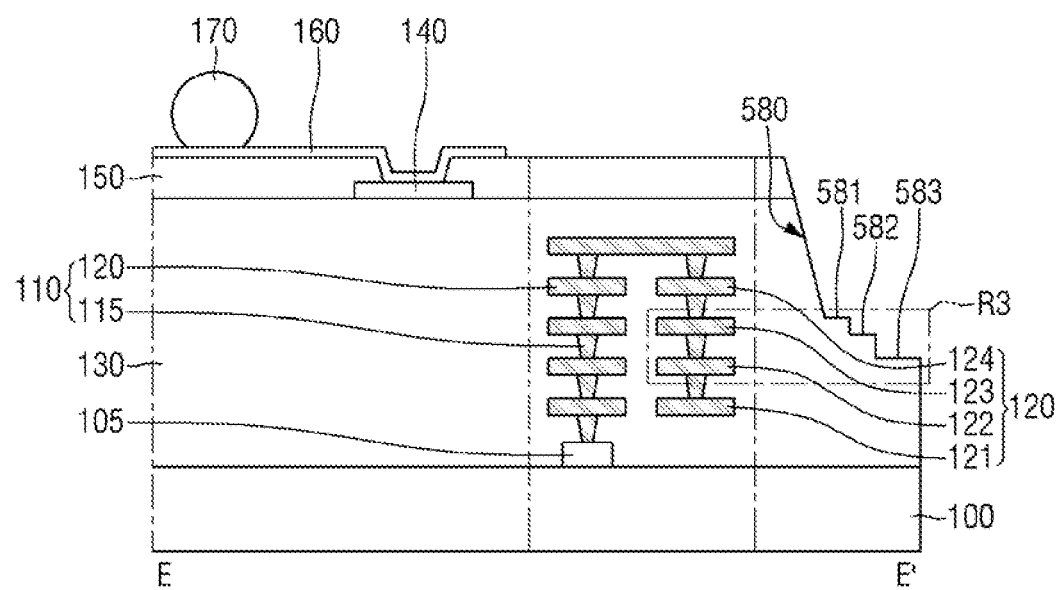
FIG. 18 is a cross-sectional view taken along line E-E' of FIG. 17.
Figure 19:
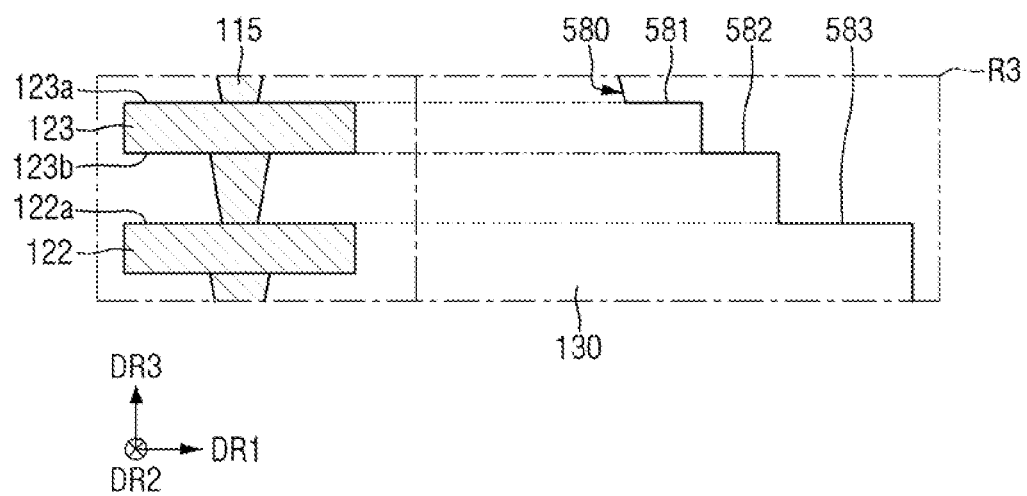
FIG. 19 is an enlarged view of area R3 of FIGS. 18.

Referring to FIGS. 17 to 19, in a semiconductor device according to an exemplary embodiment of the present inventive concept, a trench 580 may include a plurality of bottom surfaces having a stepped structure.

For example, the trench 580 may include first to third bottom surfaces 581, 582, and 583. The second bottom surface 582 of the trench 580 may be formed adjacent to the first bottom surface 581 of the trench 580 in the first horizontal direction DR1. The third bottom surface 583 of the trench 580 may be formed adjacent to the second bottom surface 582 of the trench 580 in the first horizontal direction DR1.

The second bottom surface 582 of the trench 580 may be formed lower than the first bottom surface 581 of the trench 580. The third bottom surface 583 of the trench 580 may be formed lower than the second bottom surface 582 of the trench 580. Each of the second bottom surface 582 of the trench 580 and the third bottom surface 583 of the trench 580 may be integrally formed to at least partially surround the guard ring region II. For example, each of the second bottom surface 582 of the trench 580 and the third bottom surface 583 of the trench 580 may completely surround the guard ring region II.

For example, the first bottom surface 581 of the trench 580 may be formed on substantially the same plane as the top surface 123a of the third wiring layer 123. The second bottom surface 582 of the trench 580 may be formed on substantially the same plane as the bottom surface 123b of the third wiring layer 123. The third bottom surface 583 of the trench 580 may be formed on the same plane as a top surface 122a of the second wiring layer 122.

Hereinafter, a semiconductor device according to an exemplary embodiment of the present inventive concept will be described with reference to FIG. 20. With regard to FIG. 20, differences from the semiconductor device shown in FIGS. 17 to 19 will be mainly described.

FIG. 20 is a schematic plan view illustrating a semiconductor device according to an exemplary embodiment of the present inventive concept.

Referring to FIG. 20, a trench 680 may include a plurality of bottom surfaces having a stepped structure and spaced apart from each other.

For example, the trench 680 may include first to fifth bottom surfaces 681, 682, 683, 684, and 685. The third bottom surface 683 of the trench 680 may be formed adjacent to the second bottom surface 682 of the trench 680 in the first horizontal direction DR1. The fifth bottom surface 685 of the trench 680 may be formed adjacent to the fourth bottom surface 684 of the trench 680 in the first horizontal direction DR1.

The fourth bottom surface 684 of the trench 680 may be spaced apart from the second bottom surface 682 of the trench 680 in the second horizontal direction DR2. The first bottom surface 681 of the trench 680 may be formed between the fourth bottom surface 684 of the trench 680 and the second bottom surface 682 of the trench 680. The fifth bottom surface 685 of the trench 680 may be spaced apart from the third bottom surface 683 of the trench 680 in the second horizontal direction DR2. The first bottom surface 681 of the trench 680 may be formed between the fifth bottom surface 685 of the trench 680 and the third bottom surface 683 of the trench 680.

The second bottom surface 682 of the trench 680 and fourth bottom surface 684 of the trench 680 may be formed on substantially the same plane. The third bottom surface 683 of the trench 680 and the fifth bottom surface 685 of the trench 680 may be formed on substantially the same plane.

For example, the first bottom surface 681 of the trench 680 may be formed on substantially the same plane as the top surface 123a (see FIG. 19) of the third wiring layer 123 (see FIG. 19). Each of the second bottom surface 682 of the trench 680 and the fourth bottom surface 684 of the trench 680 may be formed on substantially the same plane as the bottom surface 123b (see FIG. 19) of the third wiring layer 123 (see FIG. 19). Each of the third bottom surface 683 of the trench 680 and the fifth bottom surface 685 of the trench 680 may be formed on substantially the same plane as the top surface 122a (see FIG. 19) of the second wiring layer 122 (see FIG. 19).

While the present inventive concept has been described with reference to exemplary embodiments thereof, it will be understood by those of ordinary skill in the art that various changes in form and details may be made thereto without departing from the spirit and scope of the present inventive concept.

What is claimed is:

1. A semiconductor device comprising:
a substrate including a semiconductor chip region, a guard ring region at least partially surrounding the semiconductor chip region, and an edge region at least partially surrounding the guard ring region;
a first interlayer insulating layer disposed on the substrate;
a wiring structure disposed inside the first interlayer insulating layer and in the guard ring region, wherein the wiring structure includes a first wiring layer and a second wiring layer disposed above a top surface of the first wiring layer; and
a trench configured to expose at least a part of a sidewall of the first interlayer insulating layer in the edge region, wherein the trench includes a first bottom surface and a second bottom surface formed at a level different from that of the first bottom surface,
wherein the first bottom surface of the trench is formed between the wiring structure and the second bottom surface of the trench, and the second bottom surface of the trench is formed adjacent to the first bottom surface of the trench in a first horizontal direction.

2. The semiconductor device of claim 1, wherein the first bottom surface of the trench is formed on substantially the same plane as the top surface of the tint wiring layer.

3. The semiconductor device of claim 1, wherein the second bottom surface of the trench is formed on substantially the same plane as a bottom surface of the first wiring layer.

4. The semiconductor device of claim 1, further comprising:
a conductive pad disposed on the first interlayer insulating, layer in the semiconductor chip region;
a second interlayer insulating layer disposed on the first interlayer insulating layer and configured to expose at least a part of the conductive pad; and
a rewiring layer disposed on the second interlayer insulating layer and connected to the conductive pad.

5. The semiconductor device of claim 1, wherein a width of the first bottom surface of the trench in the first horizontal direction is smaller than a width of the second bottom surface of the trench the first horizontal direction.

6. The semiconductor device of claim 1, wherein a width of the first bottom surface of the trench in the first horizontal direction is about 0.1 μm to about 5 μm.

7. The semiconductor device of claim 1, wherein a width of the second bottom surface of the trench in the first horizontal direction is about 0.1 μm to about 10 μm.

8. The semiconductor device of claim 1, wherein a height from the second bottom surface of the trench to the first bottom surface of the trench is about 0.1 μm to about 5 μm.

9. The semiconductor device of claim 1, wherein the trench further includes a third bottom surface spaced apart from the second bottom surface of the trench in a second horizontal direction substantially perpendicular to the first horizontal direction and formed on substantially the same plane as the second bottom surface of the trench.

10. The semiconductor device of claim 1, wherein the trench further includes:
a third bottom surface formed adjacent to the second bottom surface of the trench in the first horizontal direction and formed on substantially the same plane as the first bottom surface of the trench; and
a fourth bottom surface formed adjacent to the third bottom surface of the trench in the first horizontal direction and formed on substantially the same plane as the second bottom surface of the trench.

11. The semiconductor device of claim 10, wherein the trench further includes:
a fifth bottom surface spaced apart from the second bottom surface of the trench in a second horizontal direction substantially perpendicular to the first horizontal direction and formed on substantially the same plane as the second bottom surface of the trench; and
a sixth bottom surface spaced apart from the fourth bottom surface of the trench in the second horizontal direction and formed on substantially the same plane as the fourth bottom surface of the trench.

12. The semiconductor device of claim 1, wherein the trench further includes a third bottom surface formed adjacent to the second bottom surface of the trench in the first horizontal direction and formed lower than the second bottom surface of the trench.

13. The semiconductor device of claim 12, wherein the trench further includes:
a fourth bottom surface spaced apart from the second bottom surface of the trench in a second horizontal direction substantially perpendicular to the first horizontal direction and formed on substantially the same plane as the second bottom surface of the trench; and
a fifth bottom surface spaced apart from the third bottom surface of the trench in the second horizontal direction and formed on substantially the same plane as the third bottom surface of the trench.

14. The semiconductor device of claim 12, wherein the wiring structure further includes a third wiring layer disposed on a bottom surface of the first wiring layer, and
the third bottom surface of the trench is formed on substantially the same plane as a top surface of the third wiring layer.

15. A semiconductor device comprising:
a substrate including a semiconductor chip region and an edge region at least partially surrounding the semiconductor chip region;
a first inter layer insulating layer disposed on the substrate;
a conductive pad disposed on the first interlayer insulating layer and in the semiconductor chip region;
a second interlayer insulating layer disposed on the first interlayer insulating layer and configured to expose at least a pan of the conductive pad;
a rewiring layer disposed on the second interlayer insulating layer and connected to the conductive pad;
a solder ball connected to the rewiring layer; and
a trench configured to expose at least a part of a sidewall of the first interlayer insulating layer and at least one sidewall of the second interlayer insulating layer in the edge region, wherein the trench includes a first bottom surface and a second bottom surface formed lower than the first bottom surface,
wherein the first bottom surface of the trench is formed between the semiconductor chip region and the second bottom surface of the trench, and the second bottom surface of the trench is formed adjacent to the first bottom surface of the trench in a first horizontal direction.

16. The semiconductor device of claim 15, wherein the trench further includes a third bottom surface spaced apart from the second bottom surface of the trench in a second horizontal direction substantially perpendicular to the first horizontal direction and formed on substantially the same plane as the second bottom surface of the trench.

17. The semiconductor device of claim 15, further comprising:
a guard ring region disposed between the semiconductor chip region and the edge region; and
a wiring structure disposed inside the first interlayer insulating layer in the guard ring region, wherein the wiring structure includes a first wiring layer and a second wiring layer disposed above a top surface of the first wiring layer.

18. The semiconductor device of claim 17, wherein the first bottom surface of the trench is formed on substantially the same plane as the top surface of the first wiring layer.

19. The semiconductor device of claim 17, wherein the second bottom surface of the trench is formed on substantially the same plane as a bottom surface of the first wiring layer.

20. A semiconductor device comprising:
a substrate including a semiconductor chip region, a guard ring region at least partially surrounding the semiconductor chip region, and an edge region at least partially surrounding the guard ring region;
a first interlayer insulating layer disposed on the substrate;
a wiring structure disposed inside the first interlayer insulating layer and in the guard ring region, wherein the wiring structure includes a first wiring layer and a second wiring layer disposed on the first wiring layer;
a conductive pad disposed on the first interlayer insulating layer in the semiconductor chip region;
a second interlayer insulating layer disposed on the first interlayer insulating layer and configured to expose at least a part of the conductive pad;
a rewiring layer disposed on the second interlayer insulating layer and connected to the conductive pad; and
a trench configured to expose at least a part of a sidewall of the first interlayer insulating layer and a sidewall of the second interlayer insulating layer in the edge region, wherein the trench includes a first bottom surface and a second bottom surface formed lower than the first bottom surface,
wherein the first bottom surface of the trench is formed between the wiring structure and the second bottom surface of the trench, and the second bottom surface of the trench is formed adjacent to the first bottom surface of the trench in a first horizontal direction, the first bottom surface of the trench is formed on substantially the same plane as a top surface of the first wiring layer, and the second bottom surface of the trench is formed on substantially the same plane as a bottom surface of the first wiring layer.

\* \* \* \* \*